United States Patent [19]

Morita

[11] Patent Number: 5,523,022
[45] Date of Patent: Jun. 4, 1996

[54] SEMICONDUCTOR COMPOUND

[75] Inventor: Yoshio Morita, Osaka, Japan

[73] Assignee: Matsushita Electric Industrial Co., Ltd., Osaka, Japan

[21] Appl. No.: 442,929

[22] Filed: May 17, 1995

Related U.S. Application Data

[62] Division of Ser. No. 160,757, Dec. 3, 1993, Pat. No. 5,427,716, which is a division of Ser. No. 894,374, Jun. 4, 1992, abandoned.

[30] Foreign Application Priority Data

Jun. 5, 1991 [JP] Japan .................................. 3-133982

[51] Int. Cl.$^6$ .................................. H01B 1/00; H01B 1/02
[52] U.S. Cl. .................................. 252/518; 136/264; 136/265; 252/62.3 E; 252/62.36 A; 252/62.3 R; 252/62.3 S; 252/62.3 T; 252/62.3 ZB; 252/62.3 ZT; 420/469; 420/529; 420/579; 423/117; 423/508; 423/511; 427/76; 437/5
[58] Field of Search .................. 252/62.3 R, 62.3 T, 252/62.3 E, 62.3 S, 62.3 GA, 62.3 ZB, 62.3 ZT, 518; 136/264, 265; 423/117, 508, 511; 420/469, 529, 579; 427/76; 437/5

[56] References Cited

U.S. PATENT DOCUMENTS

| | | | |
|---|---|---|---|
| 4,523,051 | 6/1985 | Mickelson et al. | 136/260 |
| 5,008,891 | 4/1991 | Morita | 372/45 |
| 5,045,409 | 9/1991 | Eberspacher et al. | 428/620 |
| 5,141,564 | 8/1992 | Chen et al. | 136/258 |
| 5,441,897 | 8/1995 | Noufi et al. | 437/5 |

OTHER PUBLICATIONS

Morita et al, "Formation of a Cu–Al–Se Phase with a Long Range Order by Molecular Beam Epitaxy." Jap. J. Appl. Phys. Z9,8 pp. L1379–L1381 no month included (1990).
S. N. Nenasheva et al., "Ag$_5$GaS$^4$–A New Phase in the System Ag–Ga–S", Article.
IzV. Akad. Nauk SSSR, "Neorg. Matter", vol. 14(5), pp. 846–848 (1978).
Morita et al., "Formation of a Cu–Al–Se Order by Molecular BioEpitaxy", Japanese Appln. Pbysth a Long Range 29, 8, pp. L1379–L1381 (1990).

*Primary Examiner*—Paul Lieberman
*Assistant Examiner*—Gregory R. Delcotto
*Attorney, Agent, or Firm*—Lowe, Price, LeBlanc & Becker

[57] ABSTRACT

Novel compound semiconductors are of the general formula, $X_5YZ_4$, wherein X is a member selected from the group consisting of Cu, Ag and mixtures thereof, Y is a member selected from the group consisting of Al Ga, Tl and mixtures thereof, and Z is a member selected from the group consisting of Se, S, Te and mixtures thereof. Typical of the compound semiconductors are $Cu_5AlSe_4$ and $Ag_5AlSe_4$. These compound semiconductors are especially useful for making blue to UV light-emitting devices which include n-type and p-type compound semiconductor layers made of the above compound semiconductors.

1 Claim, 2 Drawing Sheets

SEMICONDUCTOR COMPOUND

This application is a division of application Ser. No. 08/160,757 filed Dec. 3, 1993 now U.S. Pat. No. 5,427,716 which is a division of Ser. No. 07/894,374 filed Jun. 4, 1992, now abandoned.

BACKGROUND OF THE INVENTION

1. Field of the Invention

This invention relates to novel compound semiconductors which are useful as light-emitting devices such as light-emitting diodes, semiconductor laser devices and the like. The invention also relates to light-emitting semiconductor devices using the novel compound semiconductors, which have emission wavelengths ranging from blue to ultraviolet regions of the spectrum.

2. Description of the Prior Art

Light-emitting diodes have been widely used as a display device, including red light-emitting devices using AlGaAs and green light-emitting devices using GaP. For the fabrication of multi-color display devices, there is a strong demand for blue light-emitting devices which can be used in practice. Such blue LEDs have not been in use yet. On the other hand, semiconductor lasers using AlGaAs/GaAs which are compound semiconductors of the groups III–V of the periodic table have been already utilized for pickup of signals from optical disks. If the emission wavelength of the pickup semiconductor laser is made small, the quantity of information memorizable in the disk can be increased, enabling the information processing capacity of the optical disk to be increased. In the fields of laser printers, if the lasing wavelength is made short, the sensitivity of sensitive materials can be improved with an attendant increase of the printing speed. Thus, the short emission wavelength of semiconductor lasers will lead to an improvement in performance of information processing devices and house-use devices. The shortest emission wavelength of hitherto known semiconductor lasers is in the range of 580 to 690 nm covering red to yellow light regions. For this purpose, AlGaInP compound semiconductors are used. In order to fabricate blue light-emitting semiconductor devices, studies have been made on Zn(SSe) materials which have a great forbidden band gap. However; the blue light-emitting device has not been fabricated successfully from the standpoint of practical applications because such materials involve a difficulty in control of the p-type conductivity.

In U.S. Pat. No. 5,008,891, there is proposed a semiconductor light-emitting device wherein an n-type II-VI compound semiconductor layer and a p-type chalcopyrite compound layer are formed on a compound semiconductor substrate.

At present, there is a demand for fabricating blue light-emitting devices with high brightness but such devices have not been realized yet. Where semiconductor lasers are utilized in information processing apparatus such as optical recording apparatus, laser printers and the like, the emission wavelength of the semiconductor laser should be as short as possible in order to increase the information processing capacity. However, with known semiconductor lasers using III–V compound semiconductors, it is not possible to obtain an emission wavelength ranging to the blue light region. When using II–VI compound semiconductors, blue to UV light emission which is continuous and stable has never been attained owing to the difficulty in control of the p-type conductivity. Therefore, there is a strong demand for semiconductor lasers which are suitable for practical applications and are able to emit wavelengths in the range of blue to ultraviolet regions.

SUMMARY OF THE INVENTION

It is accordingly an object of the present invention to provide novel compound semiconductors which are able to emit light in the wavelength range of from blue to ultraviolet regions.

It is another object of the invention to provide a semiconductor light-emitting device using the novel compound semiconductor of the type mentioned above.

It is a further object of the invention to provide a light-emitting diode or semiconductor laser which is able to emit light in the wavelength range of from blue to ultraviolet regions.

According to one embodiment of the invention, there is provided a novel compound semiconductor of the general formula, $$X_5YZ_4$$

wherein X is a member selected from the group consisting of Cu, Ag and mixtures thereof, Y is a member selected from the group consisting of Al, Ga, Tl and mixtures thereof, and Z is a member selected from the group consisting of Se, S, Te and mixtures thereof.

The novel compound is based on the discovery that when Cu, Al and Se are epitaxially grown under controlled temperature conditions including a substrate temperature according to the MBE (molecular beam epitaxy) technique, $Cu_5AlSe_4$ consisting of 50 atomic percent of Cu, 10 atomic percent of Al and 40 atomic percent of Se is unexpectedly obtained. This compound is apparently different from a known $Cu_5AlSe_2$ chalcopyrite compound. It has also been found that Cu represented by X may be partially or fully replaced by Ag, Al represented by Y may be partially or fully replaced by at least one of Ga and Tl, and Se may be partially or fully replaced by at least one of S and Te, whereby different band gap energies are obtained along with a wide forbidden energy gap and an improved emission intensity. The novel compound semiconductors are readily controlled in either n-type or p-type conductivity by a usual manner.

According to another embodiment of the invention, there is provided a light-emitting diode which comprises a semiconductor substrate of one conductivity type, and compound semiconductor layers on the substrate, the compound semiconductor layers comprising:

a compound semiconductor layer of the one conductivity type and a compound semiconductor layer of the other conductivity type, each of which is formed of a compound semiconductor of the general formula, $$X_5YZ_4$$

wherein X is a member selected from the group consisting of Cu, Ag and mixtures thereof, Y is a member selected from the group consisting of Al, Ga, Tl and mixtures thereof, and Z is a member selected from the group consisting of Se, S, Te and mixtures thereof as defined hereinabove.

According to a further embodiment of the invention, there is also provided a semiconductor laser which comprises a semiconductor substrate of one conductivity type and compound semiconductor layers formed on the substrate in a double heterostructure laser configuration, the configuration comprising: a compound semiconductor layer of the one conductivity type and a compound semiconductor layer of the other conductivity type formed on the semiconductor substrate in this order, each of the compound semiconductor layers being formed of a compound semiconductor of the general formula, $X_5YZ_4$ wherein X is a member selected from the group consisting of Cu, Ag and mixtures thereof, Y is a member selected from the group consisting of Al, Ga, Tl and mixtures thereof, and Z is a member selected from the group consisting of Se, S, Te and mixtures thereof as defined hereinabove; and an activation layer disposed between the compound semiconductor layers and formed of a compound semiconductor whose band gap is less by approximately 0.2 eV than the compound semiconductor layers.

DETAILED DESCRIPTION AND EMBODIMENTS OF THE INVENTION

The novel compound semiconductors are first described.

During the course Of the investigations on the epitaxial growth of the $CuAlSe_2$ chalcopyrite compound in the form of a thin film according to the molecular beam epitaxy (MBE), we have found that novel compound semiconductors are obtained under controlled growth conditions which are different from those for the $CuAlSe_2$ chalcopyrite compound. Growth conditions where $CuAlSe_2$ is grown according to the MBE technique include 1030° C. for Cu, 1100° C. for Al and 210° C. for Se. It has been found that when the temperatures for Cu, Al and Se are, respectively, set at 1120° C., 1100° C. and 210° C. to form a thin film on a GaAs substrate at a growth temperature of 600° C. according to the MBE method, a thin film of $Cu_5AlSe_4$ is formed. The analysis of the composition of the thin film according to the ICP (inductively coupled plasma) method reveals that the contents of Cu, Al and Se were, respectively, 50 atomic percent, 10 atomic percent and 40 atomic percent. According to the electron beam diffraction analysis, there is obtained a pattern which corresponds to a structure identical to the zincblende structure of the GaAs substrate.

Figure 3:
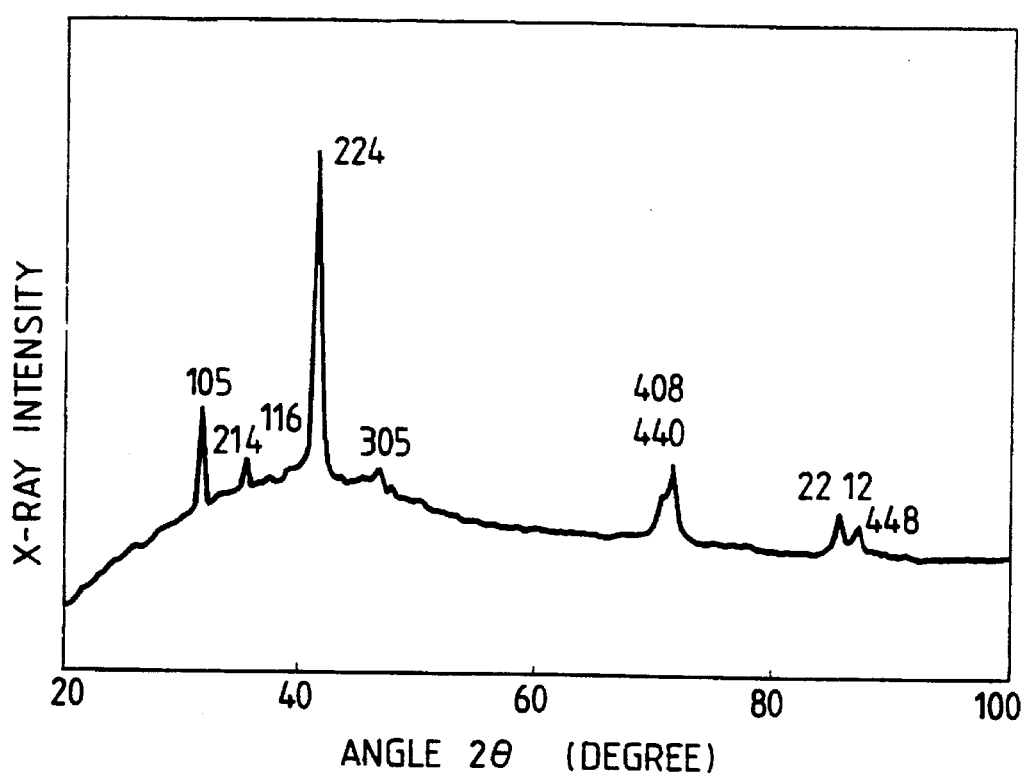
FIG. 3 is a microscopic X-ray diffraction pattern of a $Cu_5AlSe_4$ film.

The $Cu_5AlSe_4$ film which is separated from the GaAs substrate by etching is identified through microscopic X-ray diffraction using a Cr K α line, with the results shown in FIG. 3. The results reveal that the crystal has a tetragonal system with a space group of $P\overline{4}Z_{10}$. This type of crystal has never been known in the art.

Moreover, when Cu is totally replaced by Ag and the MBE procedure is effected under conditions of a temperature of 30° C. for Ag, a temperature for Al of 1100° C. and a temperature for Se of 210° C., there is obtained a material which is similarly identified as $Ag_5AlSe_4$.

Figure 4:
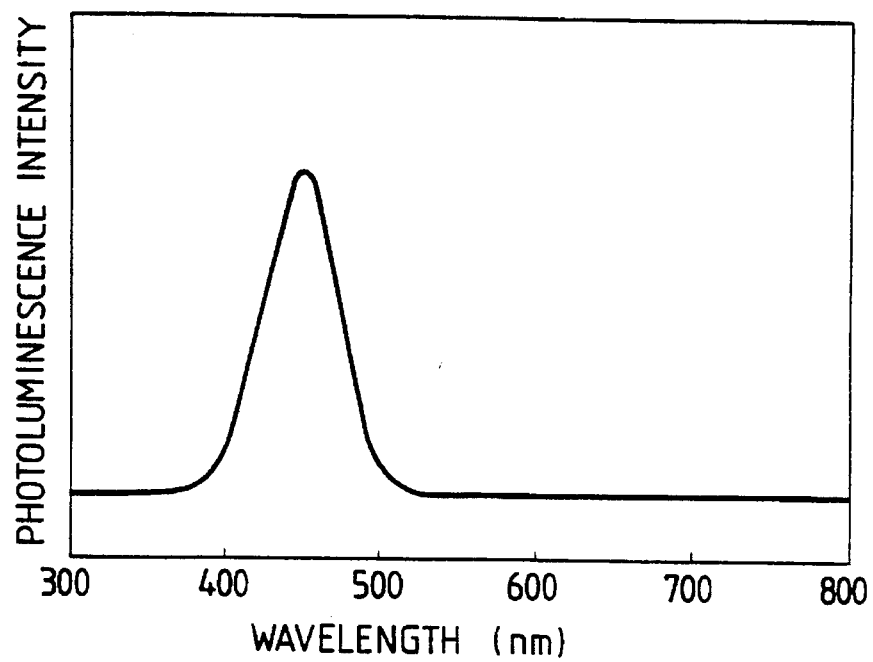
FIG. 4 is a characteristic view showing the intensity of photoluminescence in relation to the variation in wavelength of an epitaxial film of $Cu_5AlSe_4$.

Likewise, compound semiconductors where Al is replaced by Ga and/or Tl, and/or Se is replaced by S and/or Te can be similarly produced by the MBE method. The growth conditions using the respective elements include 1120° C. for Cu, 930° C. for Ag, 1100° C. for Al, 930° C. for Ga, 540° C. for Tl, 210° C. for Se, 90° C. for S and 340° C. for Te. The growth temperature is 600° C. These novel materials have been found to have optical and electric properties which are suitable for use as a semiconductor light-emitting device for short wavelength emission. For instance, the photoluminescence characteristic of a thin film of $Cu_5AlSe_4$ epitaxially grown on a GaAs substrate is shown in FIG. 4, revealing blue light emission.

It should be noted here that the novel compound semiconductor of the invention represented by the formula, $X_5YZ_4$, wherein X, Y and Z have, respectively, the same meanings as defined hereinbefore, may not exactly take compositional ratios of 5:1:4 because the individual elements have a given range of solubility. Accordingly, the contents of the respective elements in the compound semiconductor should not be construed as limitative and the crystal form and space group defined before should also be taken into account.

The $Cu_5AlSe_4$ compound semiconductor having a composition of 50 atomic percent of Cu, 10 atomic percent of Al and 40 atomic percent of Se has a band gap of 3.3 eV. By substitution of Cu with Ag, the band gas is changed to 3.5 eV. Partial substitution with Ag allows a band gap in the range of from 3.3 to 3.5. The Ag-substituted compound becomes stabilized over a long term. Where Al in the above semiconductor is replaced by Ga, and/or Tl, the band gap is in the range of from 2.3 to 3.3 error Cu(AlGa)Se, and 1.1 to 3.3 eV for Cu(AlTl)Se. Moreover, the band gap is in the range of from 2.5 to 3.5 eV for Ag(AlGa)Se, and from 1.3 to 3.5 eV for Al(AlTl)Se. Thus, the substitution of the elements of the group III permits the band gap to be changed in the range of from infrared to ultraviolet regions.

When Se is replaced by S and/or Te, the emission intensity is increased. The $Cu_5AlS_4$ compound semiconductor having a composition of 50 atomic percent of Cu, 10 atomic percent of Al and 40 atomic percent of S has a band gap of 4.0 eV. The substitution of Cu with Ag changes the band gap to 4.2 eV. When the Al element in the S-containing semiconductor is replaced by Ga and/or Tl, the band gap is in the range of from 3.0 to 4.0 eV for Cu(AlGa)S, and from 1.2 to 4.0 eV for Cu(AlTl)S. Likewise, the band gap is in the range of from 3.2 to 4.2 eV for Ag(AlGa)S, and from 1.4 to 4.2 eV for Ag(AlTl)S.

Further, the $Cu_5AlTe_4$ compound semiconductor having a composition of 50 atomic percent of Cu, 10 atomic percent of Al and 40 atomic percent of Te has a band gap of 2.5 eV. The full substitution of Cu with Ag allows the band gap to be changed to 2.7 eV. When the Al element in the above compound semiconductor is partially replaced by Ga and/or Tl, the band gap is in the range of from 1.5 to 2.5 eV for Cu(AlGa)Te and from 1.0 to 2.5 eV for 1.0 to 2.5 eV for Cu(AlTl)Te. In addition, when Cu is substituted with Ag, the band gap is in the range of from 1.7 to 2.7 eV for Ag(AlGa)Te and from 1.2 to 2.7 eV for Ag(AlTl)Te.

All the compound semiconductors set out above are controllable in either n-type or p-type conductivity. When using a p-type compound semiconductor and an n-type compound semiconductor, there can be readily obtained a pn junction type light-emitting device. Although the emission or lasing wavelength depends on the band gap of the compound semiconductor used, a wide range of the wavelength of from 300 to 1200 nm is possible. Semiconductor light-emitting devices having an emission wavelength ranging a blue to ultraviolet region are important in practical applications. To this end, those compound semiconductors having a band gap in the range of from 1.0 to 4.2 eV should be appropriately selected.

Semiconductor light-emitting devices of the invention using the compound semiconductors described hereinabove are then described with reference to FIGS. 1 and 2 wherein like reference numerals indicate like parts or members unless otherwise specified.

Figure 1:
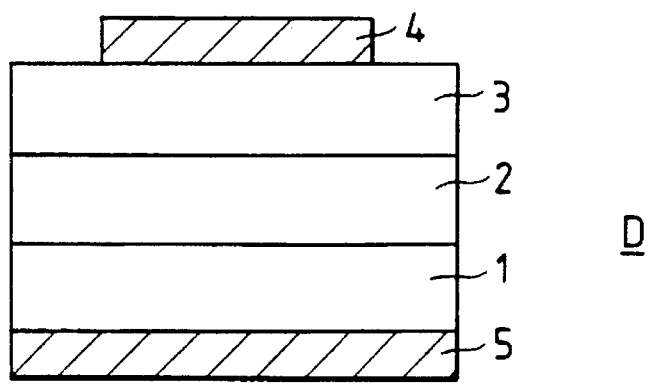
FIG. 1 is a schematic sectional view of a light-emitting diode according to one embodiment of the invention.

Reference is now made to FIG. 1 which shows a light-emitting diode generally indicated by D.

The light-emitting diode D includes a semiconductor substrate 1 of one conductivity type, and a compound semiconductor layer 2 of the one conductivity type and a compound semiconductor layer 3 of the other conductivity type formed on the substrate 1 in this order. The substrate 1 has an electrode 5 of the one conductivity type on the side opposite to that on which the layer 2 has been formed. Likewise, an electrode 4 of the other conductivity type is formed on the layer 3 as shown in the figure.

Examples of the semiconductor for the substrate 1 include GaAs, GaP, InP and the like. A desired conductivity type is realized by impurity incorporation by a usual manner.

The compound semiconductor layers 2 and 3 are successively formed on the substrate 1 by molecular beam epitaxy (MBE) preferably each in a thickness of from 0.5 to 2 µm. For instance, when a $Cu_5AlSe_4$ compound semiconductor is used as the layers 2 and 3, Cu, Al and Se are provided as source materials and the respective K cells are set at 1120° C. for Cu, 1100° C. for Al and 210° C. for Se. The substrate temperature is set at 600° C. Under these conditions, the molecular beam epitaxy is conducted to form a desired thickness of each layer. In order to impart an n-type conductivity, Zn, Cd, Cl or the like is doped during the epitaxial growth of the layer 2 or 3. For imparting a p-type conductivity, As, O, N or the like is doped. The doping is generally at a level of from $10^{18}$ to $10^{19}/cm^3$.

As stated hereinbefore, the layers 2,3 are opposite to each other with respect to the conductivity type and are, respectively, made of a compound semiconductor of the same composition.

Preferably, the respective semiconductor layers are lattice-matched with the substrate in order to avoid defects which would be formed owing to the lattice mismatch. More particularly, the compound semiconductor layers should have substantially the same value of lattice constant to that of the substrate.

The electrodes 4, 5 as shown in FIG. 1 are formed by any known technique such as vacuum deposition and the like. Au-Ge, Au-Sn, Au-Si and the like may be used as an n-type electrode and In-Ga may be used as a p-type electrode.

Figure 2:
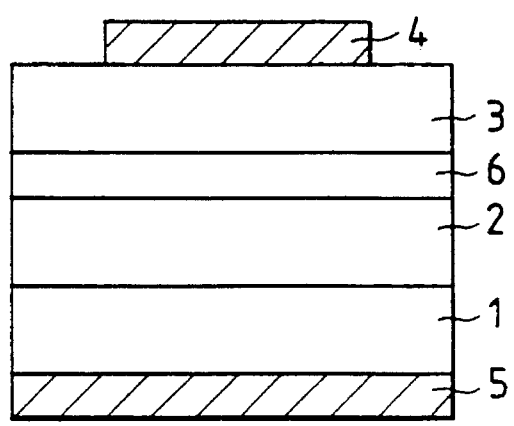
FIG. 2 is a schematic sectional view of a semiconductor laser according to another embodiment of the invention.

FIG. 2 shows a semiconductor laser device having a double heterostructure wherein an activation layer 6 is provided between the semiconductor layers 2,3 of the one and other conductivity types of FIG. 1.

The activation layer 6 is made of a compound semiconductor of the formula, $X_5YZ_4$, wherein X, Y and Z have, respectively, the same meanings as defined before provided that the band gap of the activation layer 6 is smaller by approximately 0.2 eV than those of the layers 2,3 each serving as a clad layer. Besides, other types of compound semiconductors such as ZnSe, ZnS or the like may likewise be used provided that the requirement for the band gap is satisfied.

The activation layer 6 can be formed by the MBE method as described with respect to the layers 2,3, preferably in a thickness of from 0.1 to 0.2 µm. By the formation of the activation layer 6, a semiconductor laser device having an emission wavelength in a blue to ultraviolet region can be obtained by proper selection of the compound semiconductor defined hereinbefore. In this case, lattice matching of the layers including the activation layer with the substrate is preferred.

As a matter of course, the light-emitting diode and the semiconductor laser may further comprise a buffer layer as is known in the art or may have a striped structure for current concentration, if necessary.

The present invention is more particularly described by way of examples wherein light-emitting diodes and a semiconductor laser are fabricated using the compound semiconductors of the invention.

EXAMPLE 1

A light-emitting diode having such an arrangement as shown in FIG. 1 was fabricated using $Cu_5AlSe_4$ as the layers 2, 3 of FIG. 1.

An n-type GaAs substrate was provided and had a lattice constant of 5.653 angstroms. The substrate was heated to 600° C., on which a 1 µm thick n-type $Cu_5AlSe_4$ compound semiconductor layer was formed by subjecting source materials of Cu, Al and Se by molecular beam epitaxy at K cell temperatures of Cu, Al and Se of 1120° C., 1100° C. and 210° C., respectively. The n-type $Cu_5AlSe_4$ layer was formed by doping Zn using a Zn source which was set at a K cell temperature of 190° C. Thereafter, while closing the shutter of the Zn source, a p-type $Cu_5AlSe_4$ compound semiconductor layer was formed on the first-mentioned layer by doping with As at a level of $10^{18}/cm^3$. In this arrangement, the n-type and p-type layers had a forbidden energy gap of 3.3 eV. Finally, a p-type In-Ga electrode and an n-type Au-Ge electrode were, respectively, formed as shown in FIG. 1.

A current was passed through the thus obtained light-emitting diode to evaluate a current-voltage characteristic. As a result, blue light with a emission center wavelength of 450 nm was emitted at a forward current of 40 mA with a luminous intensity of 100 mcd.

EXAMPLE 2

The general procedure of Example 1 was repeated except that the molecular beam epitaxy was effected using source materials of Ag, Al and Se and K cell temperatures of 930° C. for Ag, thereby forming an n-type $Ag_5AlSe_4$ compound semiconductor layer and a p-type $Ag_5AlSe_4$ compound semiconductor layer on the n-type GaAs substrate.

The forbidden energy gaps of the n-type and p-type layers were, respectively, 3.5 eV. The resultant light-emitting diode was a blue light emitting diode with a emission center wavelength of 420 nm and a luminous intensity of 100 mcd when a forward current of 40 mA was passed. This diode was very stable over a longer term at the operating current than the diode of Example 1. This is because the Ag compound is more stable in crystal phase than the Cu compound. In this example, the $Ag_5AlSe_4$ compound which was fully substituted for Cu in the compound of Example 1 was used as the n-type and p-type layer. The $Cu_5AlSe_4$ compound semiconductor may be partially substituted with Ag by a similar manner with similar results.

EXAMPLE 3

The general procedure of Example 1 was repeated except that an n-type $Cu_5GaSe_4$ compound semiconductor layer and a p-type $Cu_5GaSe_4$ compound semiconductor layer were epitaxially grown on an n-type GaAs substrate, thereby obtaining a pn junction-type light-emitting diode. The n-type and p-type layers had, respectively, a forbidden energy gap of 2.3 eV. The light-emitting diode had a emission center wavelength of 580 nm.

In the above example, the $Cu_5GaSe_4$ compound semiconductor is used as the layers. It will be noted that where part or all of the Cu element may be replaced by Ag and part or all of the Ga element may be replaced by Al and/or Tl, similar pn junction-type light-emitting diodes can be fabricated. In the case, the emission wavelength depends on the band gap of the compound semiconductor used. By the substitution, an emission wavelength will cover from infrared to ultraviolet regions.

EXAMPLE 4

The general procedure of Example 1 was repeated except that an n-type $Cu_5AlS_4$ compound semiconductor layer and a p-type $Cu_5AlS_4$ compound semiconductor layer were formed on an n-type GaAs substrate. The forbidden energy gaps of the n-type and p-type layers were, respectively, 4.0 eV. The light-emitting diode had an emission center wavelength of 360 nm, thus emitting UV light. The substitution of Se with S permits a luminous intensity which is higher by about one order of magnitude than that of the diode using the Se-based compound semiconductor. This effect develops when the Se element in the Se-based compound semiconductors is replaced partially or as a whole by S and/or Te.

EXAMPLE 5

This example illustrates a semiconductor laser device.

The semiconductor laser device was fabricated according to the molecular beam epitaxy similar to Example 1. An n-type GaAs substrate 1 was first provided, on which a 1 μm thick n-type $Cu_5AlSe_4$ compound semiconductor 2, a 0.12 μm thick activation layer 8 made of $Cu_5(Al_{0.7}Ga_{0.3})Se_4$ compound semiconductor, and a 1 μm thick p-type $Cu_5AlSe_4$ layer 8 were epitaxially formed in this order by the use of K cells of sources of Cu, Al, Ga and Se at a growth temperature of 600° C. The n-type layer 2 was formed by doping Zn at a level of $10^{18}$ $cm^{-3}$ and the p-type layer 3 was formed by doping As at a level of $10^{18}$ $cm^{-3}$. The activation layer 6 had a forbidden band gap of 3.0 eV.

The resultant semiconductor laser was passed with a current to evaluate a current-laser output characteristic. As a result, when a forward current of 80 mA was passed, the lasing output was 5 mW with an emission wavelength of 410 nm. Thus, the semiconductor laser was a blue light-emitting laser.

In this example, the n-type and p-type $Cu_5AlSe_4$ compound semiconductor layers and the $Cu_5(Al_{0.7}Ga_{0.3})Se_4$ compound semiconductor activation layer were used. Where a compound semiconductor whose band gap is smaller by approximately 0.2 eV than the n-type and p-type compound semiconductors is used, a double heterostructure semiconductor laser as shown in FIG. 2 can be likewise fabricated. In the case, the emission wavelength depends mainly on the band gap of the compound semiconductor activation layer. As stated hereinbefore, the activation layer may be made of any compound semiconductor which is smaller by approximately 0.2 eV than those compound semiconductors used as the cladding layers.

In all the examples, the substrate used is of an n-type, so that an n-type compound semiconductor layer and a p-type compound semiconductor are formed in this order for the light-emitting diodes, and an n-type compound semiconductor layer, an activation layer and a p-type compound semiconductor are formed on the n-type substrate in this order for the semiconductor laser devices. If a p-type substrate is used, a p-type layer and an n-type layer are formed on the p-type substrate in this order for the light-emitting diode. Likewise, a p-type layer, an activation layer and an n-type layer are formed on the p-type substrate for the semiconductor laser.

What is claimed is:

1. A compound semiconductor of the general formula, $X_5YZ_4$, wherein X is Cu, Y is Al and Z is a mixture consisting of Se and S.

* * * * *